United States Patent
Nihonmatsu et al.

(10) Patent No.: US 7,332,437 B2
(45) Date of Patent: *Feb. 19, 2008

(54) METHOD FOR PROCESSING SEMICONDUCTOR WAFER AND SEMICONDUCTOR WAFER

(75) Inventors: Takashi Nihonmatsu, Nagano (JP);
Masahiko Yoshida, Nagano (JP);
Yoshinori Sasaki, Nagano (JP);
Masahito Saitoh, Nagano (JP);
Toshiaki Takaku, Fukushima (JP);
Tadahiro Kato, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 251 days.

This patent is subject to a terminal disclaimer.

(21) Appl. No.: 10/312,750

(22) PCT Filed: Jun. 25, 2001

(86) PCT No.: PCT/JP01/05401

§ 371 (c)(1),
(2), (4) Date: Dec. 27, 2002

(87) PCT Pub. No.: WO02/01616

PCT Pub. Date: Jan. 3, 2002

(65) Prior Publication Data

US 2003/0171075 A1    Sep. 11, 2003

(51) Int. Cl.
*H01L 21/461* (2006.01)

(52) U.S. Cl. ...................... 438/691; 438/745; 438/747; 438/750; 438/753; 216/88

(58) Field of Classification Search ................ 438/747, 438/750, 753, 691, 745; 216/88
See application file for complete search history.

(56) References Cited

U.S. PATENT DOCUMENTS 5,340,437 A * 8/1994 Erk et al. ................... 438/747

(Continued)

FOREIGN PATENT DOCUMENTS

JP           03-001537           1/1991

(Continued)

*Primary Examiner*—Binh X. Tran
(74) *Attorney, Agent, or Firm*—Hogan & Hartson LLP

(57) ABSTRACT

There is provided a method for processing a semiconductor wafer subjected to a chamfering process, a lapping process, an etching process, and a mirror-polishing process, wherein acid etching is performed after alkaline etching as the etching process, and the acid etching is performed with an acid etchant composed of hydrofluoric acid, nitric acid, phosphoric acid, and water, a method for processing a semiconductor wafer subjected to a chamfering process, a surface grinding process, an etching process, and a mirror-polishing process, wherein the etching process is performed as described above, and a method for processing a semiconductor wafer subjected to a flattening process, an etching process, and a mirror-polishing process, wherein the etching process is performed as described above, a back surface polishing process is performed after the acid etching as the mirror-polishing process, and then a front surface polishing process is performed. According to this, there can be provided a method for processing a semiconductor wafer to have good flatness, good surface roughness, and good condition on a back surface thereof.

27 Claims, 3 Drawing Sheets

U.S. PATENT DOCUMENTS

| | | | | |
|---|---|---|---|---|
| 5,494,862 A | * | 2/1996 | Kato et al. | 438/693 |
| 5,756,399 A | * | 5/1998 | Hajime et al. | 438/692 |
| 5,800,725 A | * | 9/1998 | Kato et al. | 216/88 |
| 5,821,166 A | * | 10/1998 | Hajime et al. | 438/691 |
| 5,899,731 A | * | 5/1999 | Kai et al. | 438/471 |
| 5,914,281 A | * | 6/1999 | Abe et al. | 438/747 |
| 6,234,873 B1 | * | 5/2001 | Yamamoto et al. | 451/41 |
| 6,239,039 B1 | * | 5/2001 | Nihonmatsu et al. | 438/749 |
| 6,338,805 B1 | * | 1/2002 | Anderson | 216/89 |
| 6,514,423 B1 | * | 2/2003 | Ng et al. | 216/38 |
| 6,600,557 B1 | * | 7/2003 | Stefanescu et al. | 356/237.2 |

FOREIGN PATENT DOCUMENTS

| | | |
|---|---|---|
| JP | 09-306897 | 11/1997 |
| JP | 10-055990 | 2/1998 |
| JP | 11-135464 | 5/1999 |
| JP | 11-233485 | 8/1999 |
| JP | 11-260771 | 9/1999 |
| JP | 11-288858 | 10/1999 |
| JP | 2000-150431 | 5/2000 |

* cited by examiner

METHOD FOR PROCESSING SEMICONDUCTOR WAFER AND SEMICONDUCTOR WAFER

TECHNICAL FIELD

The present invention relates to a semiconductor wafer and more particularly relates to the improvement of a method to remove a mechanically damaged layer on a wafer surface generating in a production process of the single crystal silicon wafer by a chemical etching and the improvement of a wafer back surface state resulted from a production method of the single crystal silicon wafer.

BACKGROUND ART

Conventionally, a production process of semiconductor mirror-polished wafers usually comprises processes that wafers are obtained by slicing a single crystal ingot made of silicon or the like, and the obtained semiconductor wafers are subjected to at least chamfering, lapping, etching, mirror-polishing, and cleaning/drying. An example of such a production process of semiconductor mirror-polished wafers is shown in FIG. 3. These processes are performed variously depending on the purpose, that is, a part of the process is replaced or repeated plural times, or processes such as heat treatment, grinding or the like are added or substituted. For example, in some cases, a polishing process is performed about 3 steps, or a surface grinding process is added prior to a polishing process.

Generally, etching is intended to remove a surface mechanical damaged layer introduced in mechanical processing such as slicing, chamfering, lapping, or the like, and an etching process is performed after a flattening process such as lapping process or the like. For example, an usual acid etching process is that several to dozens micrometers from the wafer surface is etched by a mixed acid aqueous solution composed of hydrofluoric acid, nitric acid, acetic acid and water.

By acid etching, a mechanically damaged layer can be removed, but flatness of a wafer is easily degraded in proportion to increase of its etching removal. Particularly, an etching amount in a peripheral portion of a wafer is larger than that in the other portion thereof, and degradation of flatness is remarkable in the peripheral portion. Also, there is a problem that harmful $NO_X$ is generated by chemical reaction in acid etching.

In order to avoid these problems, alkali etching has been sometimes used. However, when etching is performed by using an alkaline type etching solution as an etchant, the flatness after lapping is maintained as it is, but pits having a depth of several micrometers and a size of from several to dozens micrometers are easily formed locally on a wafer surface. It is considered that a large part of local mechanical damages generating in a lapping process is etched deeper than the other part due to anisotropy of alkali etching, so that pits are formed thereon.

As described above, since flatness of a wafer is degraded by acid etching and pits are formed on a wafer by alkaline etching, it is necessary to increase a stock removal for mirror-polishing to remove those. However, by increasing stock removals, the flatness is degraded by polishing and productivity of a polishing process is decreased drastically.

Thus, as previously disclosed in Japanese Patent Laid-Open No. 11-233485, the present applicant suggested a resolution such that in an etching process, acid etching was performed after alkaline etching on the condition that a etching amount of alkaline etching was larger than that of acid etching by a mixed acid aqueous solution composed of hydrofluoric acid, nitric acid, acetic acid and water. As a result, although the flatness was able to be achieved sufficiently, it was not always enough reduction of a stock removal to obtain a mirror-polished wafer (PW). In late years, reduction of a stock removal has become still more important in the requirement of further high flatness.

Therefore, it was considered as a technique that a (surface) grinding process was performed just before a polishing process and then a wafer surface is polished so as to shorten a polishing time and to prevent peripheral sags. However, it was difficult to control a residual grinding striation and a grinding damage by grinding, and it was difficult to control a grinding damage at 3 μm or less.

Moreover, it became clear that in wafer processing, degradation of brightness (glossiness) on a back surface of a wafer, generation of waviness (periodic surface roughness of 2 mm or more) and a stain, so-called a blue stain (hereinafter, merely called as a stain), which is easily generated in a low resistivity crystal, were easily appeared. Particularly, by conditions of an etching process (for example, when an etching amount was reduced), there was a case that glossiness on a back surface of the wafer was degraded in about 15-20%.

In this regard, glossiness of a wafer (back surface) according to the present invention refers to JIS Z 8741 (a relative-specular glossiness measuring method), and the glossiness was measured with a relative-specular glossmeter (glossmeter SD) designated by that standards based on the above method. In other words, the glossiness was estimated on setting conditions that brightness in a state that nothing is put on an object position was imagined with 0% for the sake of convenience, and it was assumed that glossiness of a mirror-polished surface was 100%.

Conventionally, sometimes mirror-polishing has been performed on both sides of a wafer, but if a back surface thereof is completely mirror-polished (its glossiness is increased around 100%), there is a problem that particles are easily attached thereto and easily released therefrom again, or a problem of a contact area such as a electrostatic chuck or the like used for adsorbing a wafer, so that it is necessary to decrease glossiness to a certain range. Depending on a device process or the like, glossiness is preferably about 30-60% generally.

Generally, each glossiness of both sides of a wafer depends upon an etching process. In order to obtain a wafer having a high flatness, an etching amount is preferably reduced in an etching process. In the method that acid etching was performed after alkaline etching, conventionally, etching was preferably performed on the condition that an etching amount of both sides in total in alkaline etching is about 10-30 μm, particularly 20 μm and etching amount of both sides in total in acid etching is about 5-20 μm, particularly 10 μm, and the total etching amount of both sides in the whole etching process was about 30-40 μm. According to this, glossiness can be controlled to about 40%, but sometimes there is a problem that when an etching amount was further reduced, glossiness was reduced to 20% or less. Therefore, in the case that a method for processing a semiconductor wafer that acid etching is performed after alkaline etching, there was a problem of quality of a back surface thereof.

DISCLOSURE OF THE INVENTION

The present invention was accomplished in view of such problems, and its main object is to provide a method for processing a semiconductor wafer and a semiconductor wafer processed by the method wherein a chemical etched wafer (CW) such that while maintaining flatness of a wafer, a mechanical damaged layer is removed, surface roughness is improved, particularly, local deep pits are more shallow, and the wafer has a smooth uneven shape and has an etched surface difficult to generate particle or contamination is manufactured, and its stock removal can be reduced in a mirror-polishing process and quality (glossiness, waviness and stain) of a back surface of the wafer can be improved.

In order to solve the above-described problems, the invention of a method for processing a semiconductor wafer according to the present invention that the wafer obtained by slicing a single crystal ingot is subjected to at least a chamfering process, a lapping process, an etching process, and a mirror-polishing process, wherein acid etching is performed after alkaline etching as the etching process, and the acid etching is performed with an acid etchant composed of hydrofluoric acid, nitric acid, phosphoric acid, and water.

As described above, in the etching process, a wafer after lapping is firstly subjected to alkaline etching, and a mechanical damaged layer is removed while maintaining flatness of the wafer after lapping, and then acid etching is performed, so that local deep pits remaining after alkaline etching, surface roughness, and sharp uneven shape can be improved.

In this regard, if acid etching is performed with an acid etchant composed of hydrofluoric acid, nitric acid, phosphoric acid, and water, waviness (surface roughness with a period of 2 mm or more) can be more lowered and pit depth can be shallower than acid etching with a conventional acid etchant composed of hydrofluoric acid, nitric acid, and acetic acid. Therefore, a stock removal in the polishing process can be reduced, and productivity in the polishing process can be improved. Moreover, since the stock removal can be reduced, degradation of flatness in the polishing process can be prevented, and thus a wafer having high flatness can be produced much more easily. It is considered that an agent solution of a mixed acid does not easily run into pits owing to viscosity of phosphoric acid, and therefore an etching rate in pits becomes slower than that on the other plain.

Also, the feature of the present invention is that a method for processing a semiconductor wafer that the wafer obtained by slicing a single crystal ingot is subjected to at least a chamfering process, a surface grinding process, an etching process, and a mirror-polishing process, wherein the surface grinding process is performed prior to the etching process, acid etching is performed after alkaline etching as the etching process, and the acid etching is performed with an acid etchant composed of hydrofluoric acid, nitric acid, phosphoric acid, and water.

And in this case, according to the method of producing a semiconductor described above, it is preferable that a lapping process is further added to the method and the processing is performed by a lapping process, a surface grinding process, and an etching process in order.

As described above, since in the present invention, a conventional lapping process is completely substituted with a surface grinding process, or a lapping process is added and a surface grinding process is preformed prior to a etching process, a large mechanical damaged layer, which is locally generated, can be reduced remarkably and generation of deep pits can be suppressed.

And, in the surface grinding process, as compared to the lapping process, a shape of the wafer can be easily controlled relatively, and each wafer having the same shape can be stably obtained. Moreover, variation of thickness of wafers can also be suppressed.

The surface grinding can remove pits remaining on a wafer even after the lapped wafer is etched. According to this, it is considered that the surface grinding process is performed after the etching process. However, by the surface grinding, a pattern called a grinding striation remains on the wafer surface. It was found that in order to remove the grinding striation, an etching amount is necessary to be increased in a polishing process, and therefore flatness of the wafer is degraded. Accordingly, in the present invention, the surface grinding process is performed prior to the etching process. Particularly, in the process combining a lapping process, it is preferable that the processing is performed by the processes of lapping, surface grinding, and an etching process in order.

In this regard, it is preferable that a chamfering process is performed after a surface grinding process. Also, in the case that the processing includes a lapping process, it is preferable that the chamfering process is performed prior to the lapping process. This is because a lapping slurry is used in the lapping process, and if a wafer is not chamfered, there may be the case that the lapping slurry is hard to run into a wafer central portion, and therefore a peripheral portion of the wafer is extremely sagged. Also, in the case that the processing includes a lapping process and a surface grinding process, it is preferable that the processing includes a plural number of chamfering processes (at least 2 processes). In short, the chamfering process is not particularly limited, and the chamfering process can be inserted properly between the processes depending on its purpose, and it is possible to replace the chamfering process or add chamfering processes between plural processes.

Also, it is possible that both sides of a wafer can be ground in a surface grinding process, and only a front surface (which is a polished surface in a polishing process in the case that one side of the wafer is mirror-polished) of a wafer can be ground. Particularly, in the case that a lapping process is performed prior to a surface grinding process, it is preferable that only one side, which is a polished side polished in the polishing process, of a wafer is polished. This is because a back surface (which is not ground) of a finishing mirror-polished wafer after polishing has the same glossiness as a back surface of a conventionally used wafer.

In the case that a finished mirror-polished wafer is completed to be a double-side mirror-polished wafer, it is preferable that both sides of a wafer is grounded in the surface polishing process. In this case, a lapping process is not necessarily required. It is preferable that if the lapping process is omitted, the number of process is reduced and stock removals of both sides of a wafer is also reduced in a polishing process. In short, the side polished in the polishing process is subjected to a surface grinding. However, if there is no standard for a back surface shape of a finishing mirror-polished wafer particularly, a wafer having a high flatness can be obtained even by double-side grinding in a surface grinding process and single-side polishing in a polishing process.

Next, in the present invention, a grinding striation generated in a surface grinding process must be removed by an etching process performed after a surface grinding process.

This grinding striation is also a kind of a mechanical damaged layer and it is considered that the grinding striation has a damage of about 6 μm. Therefore, there is a case that if a wafer subjected to surface grinding is subjected to an alkaline etching, generation of local deep pits generated after alkaline etching is performed after a lapping process can be prevented, but a portion of the grinding striation subjected to a surface grinding is retained or emphasized to make the portion pit-shaped.

And in order not to generate a pit due to such a grinding striation even in an etching process, an alkaline etching is combined with an acid etching so as to remove damage while maintaining a flatness of a wafer. Namely, in the etching process, first, after alkaline etching is performed, acid etching is performed. As described above, in the etching process, a wafer after a surface grinding is subjected to the alkaline etching first, so that a mechanical damaged layer is removed while maintaining a flatness of the wafer after the surface grinding, and an acid etching is performed, so that a grinding striation, surface roughness, and sharp and uneven shape remaining after the alkaline etching can be improved while maintaining the flatness. In this case, it is preferable that the etching amount of the alkaline etching is larger than that of the acid etching.

And in this case, if the acid etching is performed with an etchant composed of hydrofluoric acid, nitric acid, phosphoric acid, and water, waviness can be further reduced and pits generated due to grinding striation can be shallow better than the case that acid etching is performed with a conventionally and generally used acid etchant of types of hydrofluoric acid, nitric acid, and acetic acid. Therefore, since a stock removal in the subsequent polishing process can be reduced, productivity in the polishing process can be improved. Moreover, a since stock removal is reduced, degradation of flatness of the wafer in the polishing process can be suppressed, so that the wafer having high flatness can be much easily produced.

Also, the present invention provides a method for processing a semiconductor wafer that the wafer obtained by slicing a single crystal ingot is subjected to at least a flattening process, an etching process, and a mirror-polishing process, wherein the flattening process is performed as a previous step of the etching process, acid etching is performed after alkaline etching as the etching process, the acid etching is performed with an acid etchant composed of hydrofluoric acid, nitric acid, phosphoric acid, and water, and a back surface polishing process is performed as the mirror-polishing process after the acid etching, and then a front surface polishing process is performed.

As described above, in the mirror polishing process, since the back surface polishing process is performed after the acid etching and then the front surface polishing process is performed, quality of the back surface of the wafer (glossiness, waviness, and stain) can be improved. Also, since the back surface polishing process is performed prior to the front surface polishing process, generation of transference of waviness on the back surface of the wafer into the front surface thereof can be reduced, a stock removal for the surface polishing can be further reduced, a nanotopography level of unevenness can be disappeared, degradation of flatness due to polishing can be suppressed, and therefore there is an advantage that a wafer having high flatness can be obtained. Moreover, since the stock removal can be reduced, productivity of the polishing process can be extremely improved.

In this case, the flattening process comprises a lapping process and/or a surface grinding process.

As described above, according to the processing method of the present invention, the flattening process comprises a lapping process and/or a surface grinding process, and in the subsequent etching process and the mirror polishing process, the shape and flatness of the wafer can be maintained and a grinding striation can be effectively removed, so that a wafer can be processed to have high flatness and to improve surface roughness and waviness.

In this case, it is preferable that the back surface polishing process is performed so that glossiness of the wafer is 35-50%.

As described above, if the polishing is performed so that glossiness is 35-50%, generation of particles and a contact area for electrostatic chuck or the like to adsorb a wafer do not become a problem.

Moreover, it is desirable that the surface grinding process is performed so that a peripheral portion of the wafer becomes thicker.

By the surface grinding, a wafer can be processed to have high flatness. However, in order to make a polished wafer highly flat, it is preferable that there is prepared a wafer of which peripheral portion (within a range of about 5 mm from a periphery) is about 0.06 μm thicker than the other portion in the case of a stock removal having a thickness of 1 μm in the polishing process. This is because the peripheral portion of the wafer is easy to become thinner than the other portion thereof in the etching process and polishing process, which are later processes than the surface grinding process. In the surface grinding process, a shape of the wafer is controlled like such a shape that a peripheral portion of a wafer is thicker than the other portion thereof, so that the wafer can be produced stably, and as a result, a wafer having high flatness can be obtained after the polishing. Also, variation of thickness between wafers can be suppressed.

In this case, a total etching amount on both sides of the wafer in the etching process is 30 μm or less.

As described above, since a total etching amount of both sides in the etching process is 30 μm or less, a wafer having high flatness can be obtained. Particularly, peripheral sags on a wafer due to etching can be prevented.

Also, according to the present invention, a stock removal in the mirror-polishing process can be 7 μm or less.

In the mirror polishing process of the present invention, since a wafer having little waviness and extremely shallow pits can be obtained in the above etching process, the stock removal can be reduced extremely down to 7 μm or less, and a mirror polished wafer having high flatness can be obtained, so that productivity of the polishing process can be significantly improved.

In this case, in order to obtain a good polishing surface, it is preferable that a stock removal of the wafer is 2 μm or more.

It is preferable that in the etching of the present invention, a composition ratio of the acid etchant in mixing is that the concentration of hydrofluoric acid is 5-15% by weight and the concentration of phosphoric acid is 10-40% by weight.

As described above, in order to make pit depth shallow generated due to alkaline etching after lapping or grinding to reduce a stock removal, it is preferable that a composition ratio of the acid etchant in mixing (initial concentration) is that concentration of hydrofluoric acid is 5-15% by weight or less and concentration of phosphoric acid is 10-40% by weight. Under the conditions, viscosity of the etchant becomes adequate, so that pit depth can be effectively reduced, there is little effect of side reaction between phosphoric acid and hydrofluoric acid, and a silicon surface can be subjected to etching stably.

And, in this case, it is preferable that silicon is dissolved in the acid etchant so as to have a silicon concentration of 10 g/L or more.

As described above, the meltage of silicon is set in large quantity, an exchange amount of an etchant to restore the etchant to a former state can be reduced. As a result, concentration of the etchant can be easily controlled, and the acid etching condition can be stable. Also, quality such as waviness can be improved.

In this case, it is preferable that a composition ratio of the acid etchant in use is that the concentration of hydrofluoric acid is 1-7% by weight and the concentration of phosphoric acid is 18-33% by weight.

Although it is preferable that the initial concentration (concentration in mixing) is set within the above described concentration range, it is preferable that the composition ratio of the acid etchant when a wafer is actually subjected to etching (concentration in use) is that the concentration of hydrofluoric acid is 1-7% by weight and the concentration of phosphoric acid is 18-33% by weight. If the etching is performed within such a concentration range, pits become shallow and a wafer having good surface condition can be obtained. Hydrofluoric acid is gradually reduced as the etching treatment is repeated, and when a hydrofluoric acid concentration is 1% or less by weight, its etching effect becomes too low. If the concentration is beyond the above range, all or a part of the chemical is exchanged, so that the treatment can be stably performed.

It is preferable that an alkaline etchant used in the alkaline etching according to the present invention is an NaOH aqueous solution or a KOH aqueous solution.

If such an etchant is used, etching treatment effect can be further exerted certainly, a wafer has high flatness, an etching amount can be controlled relatively easily, and it can be adjusted in low cost.

Next, as for the semiconductor wafer processed by the method according to the present invention, mechanical damages are removed by alkaline etching while flatness after lapping or grinding is maintained, and then acid etching containing phosphoric acid is performed, so that a semiconductor wafer that etching on a deep pit portion particular to an alkaline-etched surface is suppressed, and surface roughness and sharp uneven shape are improved can be obtained. Particularly, a semiconductor wafer of which pit depth and waviness are improved and having further flatness can be obtained. Moreover, a semiconductor wafer having good qualities (glossiness, waviness and stain) on its back surface can also be obtained.

Moreover, a semiconductor wafer according to the present invention, which is chemically etched (CW), wherein the maximum value of a pit depth is 4 μm or less, waviness is 0.05 μm or less, and glossiness is 20-70%.

As described above, in the present invention, a chemical-etched semiconductor wafer having extremely small pit depth can be produced.

Also, the above-described mirror polishing of 7 μm or less is performed by using the above CW, there can be provided the semiconductor wafer (PW) of which front surface is mirror-polished, wherein SFQRmax is 0.1 μm or less, the maximum value of a pit depth on the surface, other than the mirror-polished one, is 4 μm or less, waviness is 0.05 μm or less, and glossiness is 20-70%.

Since the pit depth of the CW can be lowered, a stock removal can be significantly reduced when a surface of this wafer is polished. When a stock removal is increased, degradation of flatness (particularly, sags on a wafer periphery) or the like is easily generated, but if a stock removal is reduced, the degradation can be prevented, and a wafer having extremely high flatness of SFQRmax of 0.1 μm or less can be provided. Also, glossiness on a back surface of the wafer can be controlled as in a conventional wafer.

As explained above, according to the present invention, since phosphoric acid type mixed acid is used after alkaline etching, etching on a deep pit portion particular to an alkaline-etched surface is suppressed, a flat surface can be obtained, a stock removal for the mirror polishing can be reduced, and the productivity in the polishing process can be improved under the favor of high viscosity effect due to the addition of phosphoric acid. Also, waviness can be improved and flatness after mirror polishing can be drastically improved. Moreover, since a stock removal in mirror polishing is reduced, degradation of flatness in the mirror polishing can be suppressed, so that a wafer having high flatness can be easily produced.

Moreover, there can be provided a method for producing a semiconductor wafer and a processed semiconductor wafer, wherein while maintaining flatness of the wafer, a mechanical damaged layer is removed, surface roughness is improved, particularly pit depth generated thereon becomes further shallow, a chemical-etched wafer having a smooth uneven shape is manufactured, and a stock removal in the mirror polishing process is reduced about 4 μm in the whole surface. Therefore, productivity in the mirror polishing and flatness of the wafer can be improved, and cost cutting in the mirror polishing process and improvement of its quality can be made.

Also, glossiness on a back surface of the wafer and surface stain called blue stain can be prevented.

BRIEF EXPLANATION OF THE DRAWINGS

FIG. 1(a) is a flowchart showing an example of a production process according to the present invention. FIG. 1(b) is a flowchart showing another production process according to the present invention.

BEST MODE FOR CARRYING OUT THE INVENTION

Figure 1:
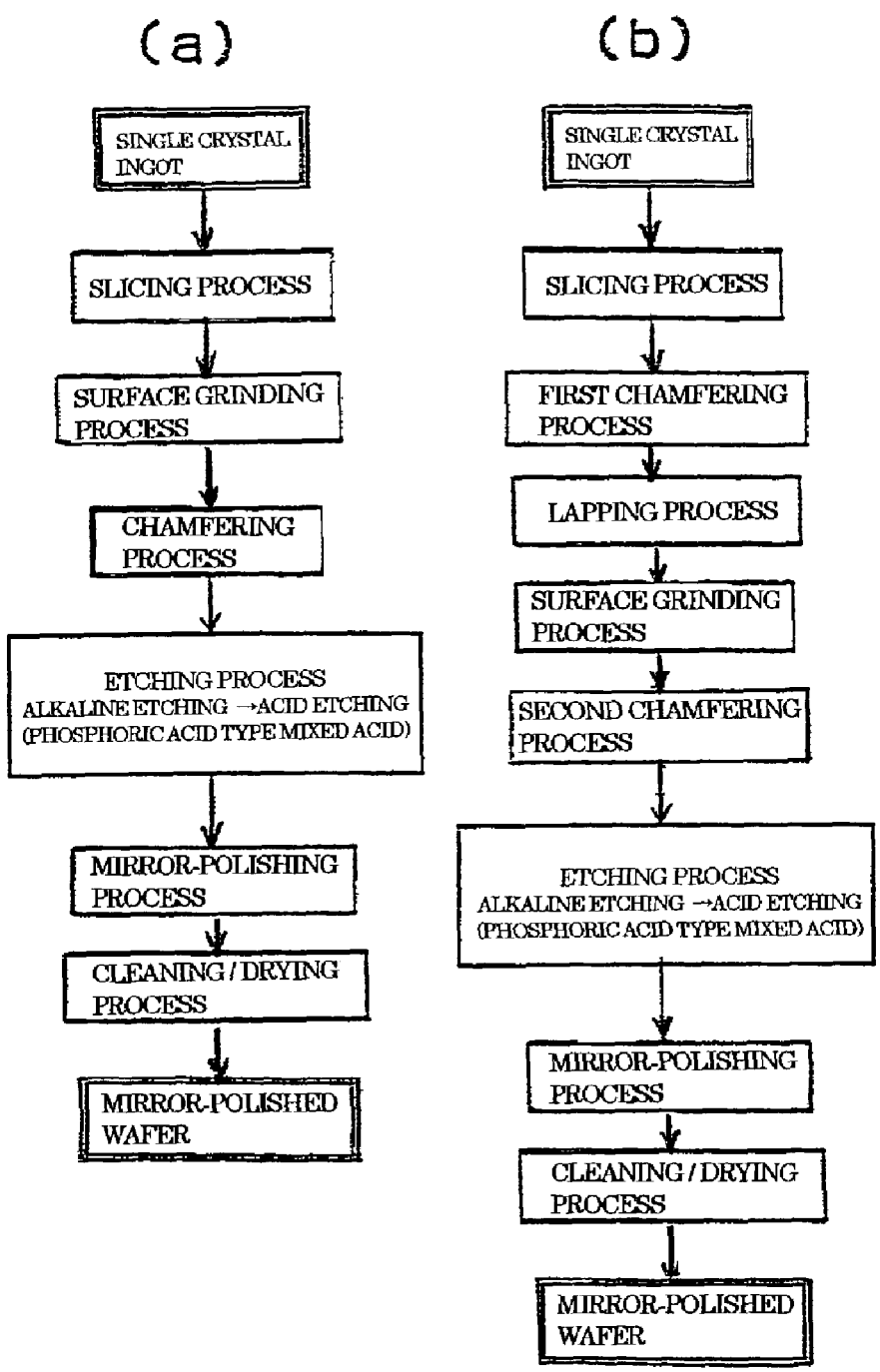
FIG. 1 includes flowcharts showing a process of producing a semiconductor mirror-polished wafer processed from a single crystal ingot.

Hereinafter, embodiments of the present invention will be explained specifically in reference to tables and drawings. However, the present invention is not limited thereto.

The present inventors performed various studies on a method of processing a semiconductor wafer, particularly an etching method that flatness of the wafer after lapping is maintained, and a chemical-etched wafer having an etched surface difficult to generate particles or contamination is manufactured. As a result, they conceived that alkaline etching is performed first so that a damaged layer is removed while maintaining flatness of a wafer after lapping, and in order to improve remaining deep pits, surface roughness or waviness, acid etching is performed by using a mixed aqueous solution composed of hydrofluoric acid, nitric acid, and phosphoric acid (sometimes called phosphoric acid type mixed acid) as an acid etchant, by not using a conventional mixed aqueous solution composed of hydrofluoric acid, nitric acid, and acetic acid (sometimes called acetic acid type mixed acid). Consequently, the present invention was accomplished through investigations of processing conditions.

First, as to basic processing conditions of alkaline etching, for example, it is sufficient that after a wafer having a diameter of 8 inches (200 mm) is subjected to lapping with #1200 lapping abrasive grains, it is subjected to alkaline etching at a temperature of 85° C. in an NaOH aqueous solution of which concentration is 50%. And, as to an etching removal of the alkaline etching, 10-30 μm on both sides in total is a proper range. Particularly, as to a condition where depth of local deep pits is near a minimum value, and TTV and Ra are not much degraded, about 20 μm is preferable.

In this regard, the local deep pits mean that pits are formed so that lapping abrasive grains stick in a wafer surface in lapping, and sizes and depths of the pits are increased by alkaline etching. Therefore, a size of lapping abrasive grains used in lapping have an influence on the pits. Also, if concentration of alkaline is low, there is a tendency that the pit depth is increased. On the contrary, if concentration of alkaline is high, the pit depth can be shallow. However, for that purpose, it is necessary to increase an etching removal, and therefore it is not efficient. Besides, this pit depth can be determined by the depth of focus of the pit utilizing an optical microscope, and in order to remove the pit, it is necessary to polish it in a mirror polishing process, which is a post-process. Therefore, it is necessary that an amount of mirror polishing is more than a maximum volume of such a deep pit depth, and therefore it is desirable that the pit becomes shallow as much as possible.

In this regard, TTV [Total Thickness Variation] (μm) means a numerical value indicating the difference of thickness between a thickest part and a thinnest part on a wafer, and it is a index of flatness of a wafer.

Also, Ra (μm) means center line average roughness, which is one of the most often used surface roughness parameter.

Next, the composition of an acid etchant was investigated and examined.

As substitute for a conventionally used acetic acid type mixed acid composed of hydrofluoric acid, nitric acid, and acetic acid, a phosphoric acid type mixed acid composed of hydrofluoric acid, nitric acid, and phosphoric acid was examined.

Namely, an acid etchant is composed of hydrofluoric acid and nitric acid as main materials capable of improving surface roughness, and phosphoric acid as substitute for a commonly used acetic acid is mixed therein. As for the reason, since phosphoric acid is stable among strong acids, it was considered that according to influence of viscosity of phosphoric acid, after phosphoric acid is entered into pits, new solution is cut off from supplies, so that etching in pits can be more slower than the other plain, and its tendency was able to be grasped qualitatively.

Therefore, a mixing ratio of hydrofluoric acid, nitric acid, and phosphoric acid was studied.

Table 1 shows observed results of mixing ratios of acids, local deep pit depths of acid-etched wafers, and surface conditions on the occasion that in order to improve waviness and remove a mechanical damaged layer, after a wafer having a diameter of 8 inches was subjected to lapping of 60 μm on both sides in total with #1200 lapping abrasive grains, the wafer was subjected to alkaline etching of 20 μm on both sides in total (hereinafter, sometimes called a wafer to be processed), and the wafer was subjected to acid etching with a mixed acid aqueous solution composed of hydrofluoric acid, nitric acid, phosphoric acid and water.

Test numbers 1-13 represent the cases where each mixing ratio of hydrofluoric acid, nitric acid, and phosphoric acid was changed, and test numbers 14 and 15 represent the cases where a conventional mixed aqueous solution composed of hydrofluoric acid, nitric acid, acetic acid was used.

After silicon of 11 g/L was dissolved in these etchants to stabilize them, a wafer to be processed was subjected to etching of 10 μm on both sides in total, and evaluated in a pit depth and surface conditions.

TABLE 1

| | Mixing Ratio (Capacity Ratio) | | | | (Initial) Concentration in mixing | | | | | Evaluation Items | |
|---|---|---|---|---|---|---|---|---|---|---|---|
| | HF | HNO$_3$ | H$_3$PO$_4$ | CH$_3$COOH | | | (% by weight) | | | Pit Depth | Surface |
| Test Nos. | 50% by weight | 70% by weight | 85% by weight | 100% by weight | HF | HNO$_3$ | H$_3$PO$_4$ | CH$_3$COOH | H$_2$O | (μm) | Condition |
| 1 | 1 | 4 | 4 | — | 4.3 | 29.4 | 42.1 | — | 24.2 | 3.0 (Note 1) | Δ |
| 2 | 1 | 3 | 3 | — | 5.5 | 28.6 | 40.9 | — | 25.0 | 3.0 (Note 1) | ○ |
| 3 | 1 | 3 | 2 | — | 6.6 | 34.1 | 32.5 | — | 26.8 | 3.0 | ⊙ |
| 4 | 2 | 6 | 3 | — | 7.3 | 37.6 | 26.9 | — | 28.2 | 4.4 | ⊙ |
| 5 | 1 | 2 | 2 | — | 7.9 | 27.0 | 38.9 | — | 26.2 | 3.2 | ⊙ |
| 6 | 1 | 3 | 1 | — | 8.1 | 42.1 | 20.1 | — | 29.7 | 4.2 | ⊙ |
| 7 | 3 | 6 | 2 | — | 11.3 | 38.9 | 18.6 | — | 31.2 | 4.0 | ⊙ |
| 8 | 1 | 1 | 1 | — | 13.6 | 23.4 | 33.5 | — | 29.5 | 3.1 | ○ |
| 9 | 2 | 1 | 2 | — | 16.3 | 14.1 | 40.2 | — | 29.4 | 5.4 (Note 2) | Δ |
| 10 | 2 | 2 | 1 | — | 16.9 | 29.2 | 20.9 | — | 33.0 | 4.3 | Δ |
| 11 | 3 | 1 | 3 | — | 17.5 | 10.1 | 43.1 | — | 29.3 | 5.8 (Note 2) | Δ |
| 12 | 4 | 1 | 4 | — | 18.1 | 7.8 | 44.7 | — | 29.4 | 5.6 (Note 2) | Δ |
| 13 | 4 | 4 | 1 | — | 19.3 | 33.2 | 11.9 | — | 35.6 | 5.2 | Δ |

TABLE 1-continued

| | Mixing Ratio (Capacity Ratio) | | | | (Initial) Concentration in mixing | | | | | Evaluation Items | |
|---|---|---|---|---|---|---|---|---|---|---|---|
| | HF | HNO$_3$ | H$_3$PO$_4$ | CH$_3$COOH | | | (% by weight) | | | Pit Depth | Surface |
| | 50% by | 70% by | 85% by | 100% by | | | | | | | |
| Test Nos. | weight | weight | weight | weight | HF | HNO$_3$ | H$_3$PO$_4$ | CH$_3$COOH | H$_2$O | (μm) | Condition |
| 14 | 1 | 2 | — | 1 | 11.5 | 39.4 | — | 20.8 | 28.3 | 7.4 | ⊙ |
| 15 | 1 | 3 | — | 2 | 7.7 | 39.7 | — | 27.9 | 24.7 | 7.1 | ⊙ |

(Note 1):
Etching was hardly performed (Etching rate is low).
(Note 2):
Because of surface roughness, pit depth was not able to be estimated accurately.
Surface condition:
⊙ . . . Very Good
○ . . . Good
Δ . . . Not Good As the result of these tests, it was found that the pit depth was able to be improved by using phosphoric acid as a substitute for acetic acid. Particularly, when etching was performed with a mixed aqueous solution containing acetic acid, its pit depth was about 7 μm, but when etching was performed with a mixed aqueous solution containing phosphoric acid, its pit depth was about 3-4 μm. Also, it was considered that when the concentration of phosphoric acid was higher, pits became smaller.

As described above, it can be found that the pit depth considerably depends on the effect of phosphoric acid.

As for the surface condition, in the case like test numbers 9, 11, or 12 that the concentration of hydrofluoric acid (% by weight) was higher than that of nitric acid, the surface became rough, and the surface was clouded, so that its glossiness was degraded. When hydrofluoric acid was too thick or nitric acid was too thin, the surface condition was degraded. Therefore, it is preferable that etching is performed under the condition that the concentration of hydrofluoric acid is thinner than that of the nitric acid. Also, like test 1, if the concentration of hydrofluoric acid was far thinner than that of nitric acid, etching was not able to be performed (little reaction was occurred). Therefore, it is preferable that the ratio (hydrofluoric acid/nitric acid) is set 1/7 or more. On such a condition of no etching (little reaction), the condition of the wafer surface is the same as the original wafer surface condition after alkaline etching, so that deep pits and rough condition in surface roughness can be remained. Also, if etching is continued, pits become lower, but etching time is getting too long, and therefore, it suffers from a problem of operations. Also, even if the concentration of phosphoric acid is 40% by weight or more, etching might be slow. It is considered that etching is difficult to proceed due to the influence of side reaction between hydrofluoric acid and phosphoric acid, or the like.

In consideration of the above findings, a wafer having very good surface condition can be obtained under the condition that the ratio (hydrofluoric acid/nitric acid) is set about 1/2, and the concentration of phosphoric acid is 40% by weight or less. Glossiness can be controlled within the wide range of 20-70% by controlling etching time.

At this point, the surface conditions of Table 1 were found through a visual inspection that each surface became rough and each glossiness was degraded or each condition after alkaline etching was remained on the surfaces, and when the wafer had the surface condition difficult to use as it was, it was regarded as Δ (not good). If the condition after alkaline etching is remained on the surface, etching is performed for a long time so that its surface condition can be improved, but there is a difficulty in terms of operations. Also, even if the surface becomes rough, its pit depth becomes shallow, so that it can be used as a raw material wafer for subjecting double-side polishing. Each surface is subjected to etching, and when the surfaces have good glossiness or have few spots, they are regarded as ○ (good). They can be used with no particular problem. Moreover, when each glossiness of the surfaces is improved, the surfaces have the same condition as the surfaces subjected to acid etching with a conventional acetic acid type mixed acid, and its glossiness can be controlled within the desired range required as products, they are regarded as ⊙ (very good). Also, the pit depth is determined by scanning a wafer surface and by the depth of focus of scanned pits utilizing an optical microscope, and maximum values of obtained pit depth are shown.

In view of each pit depth and surface condition, the preferable concentration range of phosphoric acid type mixed acid as a initial concentration in mixing is hydrofluoric acid (HF) of 5-15% by weight, nitric acid (HNO$_3$) of 20-45% by weight, phosphoric acid (H$_3$PO$_4$) of 10-40% by weight, and water (H$_2$O) as the retained material.

This is because when the concentration of hydrofluoric acid is 5% by weight or less in mixing, etching effect (reactivity) is degraded. Also, when the concentration of hydrofluoric acid is 15% by weight or more, its surface condition is degraded in relation to nitric acid. As for the nitric acid, although any definite findings can not be obtained, it is preferable that the concentration range of the nitric acid is 20-45% by weight in relation to hydrofluoric acid and phosphoric acid. Particularly, it is preferable that the ratio (HF/HNO$_3$) is 1/(2-7). As for the phosphoric acid, when its concentration is 10% by weight or less, improvement effect for pits becomes lower, and when its concentration is 40% by weight or more, side reaction with hydrofluoric acid, water, or the like is increased, etching becomes unstable, and finally etching effect wears off, so that the surface condition may be degraded.

As for the etching removal of the acid etching, the proper range is 5-20 μm on both sides in total. Particularly, when the etching removal is about 10 μm on both sides in total, the surface can be etched smoothly while pits can become shallow while maintaining its flatness. It is considered that since a mixed acid is difficult to enter into pits generated due to lapping or pits in a grinding striation portion according to influence of viscosity of phosphoric acid, etching speed in the pits is slower than that of the other plain.

Next, each composition ratio during actual etching was confirmed. In mixing, the above concentration range is preferable, but the composition varies during actual etching. When silicon wafers are etched, each composition in the chemical has each tendency that the concentration of hydrofluoric acid decreases, the concentration of nitric acid gradually decreases, the concentration of phosphoric acid does not change very much, and the concentration of water increases. Particularly, each composition was unstable immediately after etching was started.

In this regard, it is preferable that silicon is previously dissolved in the mixed acid to stabilize the etchant. The composition when silicon is dissolved therein (the composition when the etchant is actually used) was confirmed.

Table 2 shows each component's concentration in each etchant when the meltage of silicon varied from 0 to 20 g/L. As to an (initial) etchant composition in mixing, the phosphoric acid type acid, which is the same composition as that of test number 13, i.e., hydrofluoric acid of 50% by weight, nitric acid of 70% by weight, and phosphoric acid of 85% by weight are blended in a volume ratio of 1:3:2, respectively, and it was confirmed how did actual etching composition vary when silicon was dissolved therein.

Also, since it was conformed that waviness and peripheral sags were able to be extremely improved by meltage of silicon, each waviness was determined by using each etchant shown in Table 2, and a wafer was subjected to lapping with #1200 abrasive grains, and the wafer, which was subjected to alkaline etching of 20 μm on both sides in total, was subjected to acid etching of 10 μm on both sides in total to estimate each waviness. These results are also shown in Table 2.

in the height direction, the absolute values $Y_1$ to $Y_{29}$ of displacement from the origin are measured at intervals of 2 mm, and the average Y of the absolute values $Y_1$ to $Y_{29}$ represents waviness.

Waviness was measured by use of the universal surface shape measuring device (Type: SE-3F, product of Kosaka Laboratory Ltd.). Specifically, a central area of the surface of a wafer (diameter: 200 mm) was traced for 60 mm through use of a stylus within in order to measure the surface shape excluding the component of fine surface roughness.

Also, when silicon of 10 g/L is dissolved in an etchant, the composition of the etchant can be stable. An etchant right after mixing is unstable in reactivity. If a certain degree of silicon is previously dissolved in an etchant, reactivity and composition of the etchant can be stable. Also, in order to bring back to the concentration of the etching composition as silicon is not dissolved therein and right after the acids are mixed, it is necessary to exchange almost all the etchant. However, it is easy to bring back to the state of the etchant after silicon is dissolved therein, and it is sufficient that only the etchant that silicon is not dissolved is partially exchanged (added) thereto, so that an exchange volume of the etchant can be reduced. As the result, the concentration of the etchant and its variation can be lowered and easily controlled, so that the condition of acid etching can be stable.

As described above, it was found that using the mixed acid containing phosphoric acid for acid etching is superior to using a conventional acetic acid type etching in terms of the following points.

That is,

1) Pit depth can be shallow better than conventional etching of alkaline etching+acetic acid type mixed acid etching.
2) Efficiency of flatness becomes high.

TABLE 2

| | Composition of etchant after silicon is dissolved | | | | | |
|---|---|---|---|---|---|---|
| Silicon Meltage (g/L) | HF (% by weight) | $HNO_3$ (% by weight) | $H_3PO_4$ (% by weight) | $H_2O$ (% by weight) | Other by-product such as $H_3SiF_6$ | Waviness (μm) |
| 1 | 0 | 6.6 | 34.1 | 32.5 | 26.9 | — | 0.104 |
| 2 | 5 | 5.3 | 32.8 | 32.7 | 27.6 | 1.6 | 0.065 |
| 3 | 10 | 4.0 | 31.6 | 32.9 | 28.3 | 3.2 | 0.044 |
| 4 | 15 | 2.6 | 30.2 | 33.1 | 29.1 | 5.0 | 0.034 |
| 5 | 20 | 1.2 | 29.0 | 32.6 | 30.6 | 6.6 | 0.029 |

As seen from Table 2, when silicon is previously dissolved in the etchant, its concentration in mixing (initial concentration) varies. By using a phosphoric acid type mixed acid that hydrofluoric acid of 50% by weight, nitric acid of 70% by weight, and phosphoric acid of 85% by weight are blended in a volume ratio of 1:3:2, respectively, the composition of the etchant in use is that hydrofluoric acid is about 1-7% by weight, nitric acid is 25-33% by weight, and phosphoric acid is 18-33% by weight, and the etchant having such a composition range can be preferably used. Also, it is more preferable that if silicon of 10 g/L or more is dissolved therein, a very good wafer having a waviness of 0.05 μm or less can be produced. The more the meltage of the silicon is abundant, the more waviness can be reduced.

In this regard, Waviness is defined that a start point of measurement and an end point of measurement that are determined to have the same height is assumed as the origin 3) Waviness component is few.
4) Surface roughness becomes fine and glossiness is increased.

Each etching method, quality of obtained wafers, and each characteristic are arranged in Table 3 and compared. In this regard, when etching was performed only with a phosphoric acid type acid solution, there was a tendency that flatness was degraded when its stock removal was increased, as in using only an acetic acid type acid solution. Also, since an etching speed was slow, its productivity was not good. It is preferable that since a wafer is treated with the etchant (alkaline+phosphoric acid type) as the present invention, the etching removal treated with phosphoric acid type etchant can be reduced, above problems are improved, and a stock removal in the polishing process can be extremely reduced. According to the above, it is clear as to the advantage of the present invention.

TABLE 3

| Kinds of etchant | Qualities of wafer | | | |
|---|---|---|---|---|
| | Flatness | Waviness | PW stock removal | Back surface condition |
| Alkaline solution (NOH or KOH) | ⊚ (Good) | ⊚ (Small) | X (Large) | X (Rough) |
| Acid solution (Acetic acid type) | X (Bad) | X (Big) | ○ (Small) | ⊚ (Smooth) |
| Combination (Alkaline + Acetic acid type) | ○ | ○ | Δ | Δ |
| Present invention (Alkaline + Phosphoric acid type) | ○ | ⊚ | ⊚ | ○ |

[Note]
Acetic acid type (Hydrofluoric acid + Nitric acid + Acetic acid),
Phosphoric acid type (Hydrofluoric acid + Nitric acid + Phosphoric acid)

In this regard, if an etching removal (stock removal by etching) is too large, peripheral sags on a wafer are easily generated even by an etching of alkaline etching and acid etching. Therefore, in the etching process, it is preferable that the etching amount is set at about 10-30 µm on both sides in total that is smaller than a conventional stock removal. Preferably, it is set at 15 µm on both sides in total for alkaline etching and about 5 µm on both sides in total for acid etching.

According to the above-described two-stage chemical etching of alkaline etching+phosphoric acid type mixed acid etching of the present invention, a semiconductor wafer having the maximum value of pit depth of 4 µm or less, PV value of 0.05 µm or less of which waviness is at a pitch of 2 mm, and glossiness range of 20-70% can be easily produced stably.

The present inventors also performed various studies on a method for producing a wafer having less mechanical damages, pits generated due to the damages or the like before a mirror-polishing process, particularly an etching process, and its previous process, and as the result, it was conceived that by incorporating a surface grinding process as substitute for a lapping process or after a lapping process, a damaged layer generated due to slicing or lapping is extremely reduced, and a wafer maintaining a high flatness is obtained, and moreover, the wafer is subjected to alkaline etching to remove a damaged layer and grinding striation remaining in the surface grinding, and in order to improve pits due to remaining grinding striation, acid etching is performed with a mixed aqueous solution composed of hydrofluoric acid, nitric acid and phosphoric acid as an acid etchant, and the present invention was completed through investigations of processing conditions.

FIG. 1 includes series of flowcharts of processing a single crystal ingot to produce a semiconductor mirror-polished wafer. FIG. 1(a) is a flowchart showing a surface grinding process and an etching process in order. FIG. 1(b) is a flowchart showing a surface grinding process that a lapping process is added in front of the surface grinding process, and an etching process in order.

FIG. 1(a) shows a process for producing a mirror-polished wafer that a lapping process is completely substituted with a surface grinding process. A wafer is obtained by slicing a single crystal ingot in a slicing process, and the wafer is subjected to surface-grinding in a surface grinding process to improve its flatness and to remove a mechanical damaged layer generated in the slicing process. Next, the wafer is subjected to chamfering processing in a chamfering process, and the process enters upon an etching process. In the etching, alkaline etching is firstly performed to remove or shallow a damaged layer and a grinding striation, and then acid etching is performed with phosphoric acid type mixed acid to make a grinding striation shallow. On the occasion, it is preferable that an etching removal of the alkaline etching is larger than that of the acid etching. Subsequently, mirror polishing is performed in a mirror-polishing process, and cleaning and drying are performed in a cleaning/drying process to manufacture a mirror-polished wafer having high flatness.

FIG. 1(b) shows a process for producing a mirror polished wafer, wherein a lapping process is added in front of the surface grinding process. A wafer is obtained by slicing a single crystal ingot in a slicing process, and after the wafer is subjected to rough chamfering in a first chamfering process, it is lapped in a lapping process to improve its flatness and to remove a mechanical damaged layer generated in the slicing process. Subsequently, a surface grinding is performed in a surface grinding process to further improve the flatness. Next, finish chamfering processing is performed in a second chamfering process, and the process enters upon an etching process. In the etching, alkaline etching is firstly performed to remove a damaged layer and a grinding striation, and then acid etching is performed with phosphoric acid type mixed acid to shallow a grinding striation. On the occasion, it is preferable that an etching removal of the alkaline etching is larger than that of the acid etching. Subsequently, mirror polishing is performed in a mirror-polishing process, and cleaning and drying are performed in a cleaning/drying process to manufacture a mirror-polished wafer having high flatness.

First, as to a standard condition of the surface grinding, it is preferable that the rotational speed of a spindle is 4000-7000 rpm, the rotational speed of the wafer is 5-9 rpm (in processing) and 3-7 rpm (in spark out), and the feed rate of grinding stones is 0.1-0.3 µm/sec.

It is preferable that a grinding stone used therein is high Young's modulus type and a surface grinding apparatus is an in-feed type surface grinding apparatus of which grinding stone is fed from its center.

A surface grinding apparatus available is a duplex grinding apparatus, which can grind both surfaces of a wafer, or a grinding apparatus, which grind one side of a wafer at a time or only one side thereof. However, the present invention is not limited to the shape of the apparatus, particularly.

In order to improve flatness and to remove a mechanical damaged layer, generally, it is sufficient that grinding is performed at 40-60 µm on both sides in total (20-30 µm on one side).

In this regard, in the lapping process, under the influence of lapping abrasive grains, a local deep damage (pit) are formed, but the surface grinding can process a wafer with few local mechanical damage.

However, under some influence of conditions of the surface grinding process, a grinding striation is still remained by surface grinding. This grinding striation is that marks of grinding stones being fed are remained as lines on a wafer surface.

Therefore, the etching as aforementioned is performed. First, alkaline etching is performed to remove a damaged layer and a grinding striation, and acid etching is performed with phosphoric acid type mixed acid to shallow a grinding striation. Subsequently, mirror polishing is performed in a mirror polishing process, and after cleaning and drying are performed in a cleaning/drying process, a mirror polished wafer having high flatness can be manufactured.

The wafer produced by a series of the above process has very shallow or no pit and few constituents of waviness. Its surface roughness is also small and glossiness is increased. Accordingly, a polishing allowance (stock removal) in a polishing process can be extremely reduced, and therefore a wafer having high flatness can be obtained with high productivity.

On the other hand, as aforementioned, in a wafer processing process, there may be the case that luminance (glossiness) of a back surface of a wafer is degraded, waviness is generated, and contamination called blue stain (hereinafter, maybe simply called stain), which is easily generated in a low resistivity crystal is generated. Depending on conditions in the etching process (in the case that an etching removal is reduced, for example), glossiness of a back surface of a wafer is degraded at about 15-20%.

Accordingly, in order to solve this problem, the present inventors were conceived that in a mirror polishing process, after the aforementioned acid etching is performed, a back surface polishing process is performed, and then a front surface polishing process is performed.

Figure 2:
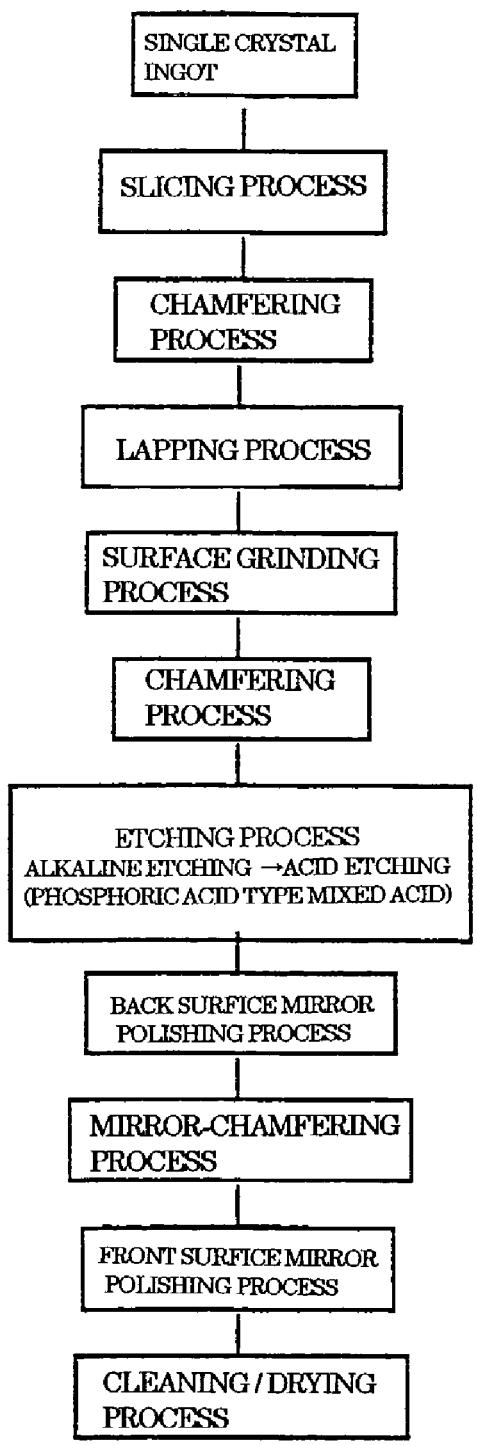
FIG. 2 is a flowchart showing a method for processing a semiconductor wafer comprising a back surface polishing process according to the present invention.

The following is the explanation of the case of performing a back surface polishing according to the present invention. FIG. 2 is a series of a flowchart showing an example of a method for processing a semiconductor wafer having a back surface polishing process according to the present invention. The feature of this method is that in addition to the method for processing a semiconductor wafer shown in FIG. 1 as aforementioned, a back surface polishing process is performed prior to a front surface polishing process that a wafer front surface is mirror-polished.

In a slicing process, a conventional method and apparatus can be used. For example, it is preferable that by using a slicing apparatus of a wire saw or an inner diameter slicer, slicing is performed so that a warp should be reduced. Particularly, slicing is performed so that a warp (bending) is reduced at 10 μm or less.

In a chamfering process, a conventional method and apparatus can be also used. It is preferable that in the early stage after slicing, a beveling process (chamfering process) is performed for rounding an edge of a wafer periphery to prevent chip or crack, and then a chamfering process that a chamfered portion is mirror-polished is performed before a surface grinding process.

Particularly, it is preferable that the chamfering process is performed after the surface grinding process. If the lapping process is performed in the process, it is preferable that the chamfering process is inserted prior to the lapping process. Needless to say, a plural number of the chamfering processes can be inserted therein. In the present proposal, an example such that a first chamfering process is inserted prior to lapping, a second chamfering process is inserted after surface grinding, and a mirror chamfering process is inserted after back surface polishing is shown.

It is sufficient that the flattening process comprises only the lapping process or only the surface grinding process. However, as aforementioned, the surface grinding process is preferable in that the generation of the mechanical damage can be more reduced, and as compared to the lapping process, the shape of a wafer can be easily controlled relatively and a wafer having the same shape can be obtained stably. It is also sufficient that in addition to the surface grinding process after the lapping process, the processes can be performed in the order of the lapping process, the surface grinding process, and the etching process.

In this regard, deep pits can be removed in the surface grinding process. Therefore, after the etching process, it can be considered that the surface grinding process is inserted prior to the polishing process, but a pattern called a grinding striation is remained in the surface grinding process. Also, a damage generated due to grinding is also remained about several micrometers. Therefore, in order to remove this grinding striation, it is necessary to increase a stock removal in the polishing process. Therefore, in the present invention, the surface grinding process is performed prior to the etching process. Particularly, it is preferable that the processes, which still comprises the lapping process, are performed in the order of the lapping process, the surface grinding process, and the etching process. According to this, deep pits generated due to lapping can be removed and a grinding striation generated due to surface grinding can be removed or can be shallow.

As to the conditions of a flattening process, in a lapping process, it is preferable that the flattening is performed with about #1200-#1500 lapping abrasive grains. It is sufficient that a lapping amount (stock removal for lapping) is about 40-60 μm on both sides in total. Preferably, as a two-step lapping, a lapping is performed at 40 μm on both sides in total with #1200 lapping abrasive grains and the other lapping is further performed at 20 μm on both sides in total with #1500 lapping abrasive grains. As described above, it is preferable that a lapping slurry containing fine abrasive grains of #1500 is used in the latter process.

In the case of the surface grinding process followed by the lapping, it is preferable that grinding stones having abrasive grains of about #1500-#4000 are used. It is sufficient that a grinding amount (stock removal for the surface grinding) is about 10 μm on one side. It is preferable that a grinding stone used in the surface grinding are high Young's modulus type and grinding apparatus is an in-feed type grinding apparatus of which grinding stones are fed from its center.

If surface grinding is performed as the flattening process, a grinding striation is still remained on a wafer even after the grinding process that damages are hard to be generated, for example. It is considered that the grinding striation is a kind of a mechanical damaged layer, and there is some deformation (damage) therein. Therefore, when the surface-ground wafer is subjected to alkaline etching, local pits existing when alkaline etching is performed after the lapping process can be prevented, but there may be the case that the portion on which a grinding striation exists, which is subjected to surface grinding, is retained or emphasized to become pits.

Conventionally, a surface grinding was performed prior to polishing to obtain a wafer having high flatness, but there was a problem that a grinding striation was still remained thereon. According to the present invention, if the surface grinding process is performed prior to front surface polishing, etching and polishing can be performed to remove a grinding striation while maintaining its shape.

Namely, in the etching process of the present invention, as aforementioned, after alkaline etching is firstly performed in the etching process, acid etching is performed. Moreover, in the acid etching, an acid etchant composed of hydrofluoric acid, nitric acid, phosphoric acid and water is used, so that waviness of a wafer can be small and the grinding striation can be shallow.

A back surface polishing process is performed after acid etching and prior to a front surface polishing process. Only adjustment of glossiness on a back surface thereof can be performed in any processes after etching (for example, it can be performed after the front surface polishing process), but if the back surface polishing process is performed after acid etching and prior to the front surface polishing process, the front surface polishing can be performed on the condition that the constituent of waviness on a wafer back surface is improved by the back surface polishing, so that the influence of transference of a back surface shape can be lowered utmost, a nanotopography level of unevenness can be reduced, and the front surface can be polished while maintaining its condition of high flatness. And, according to this, since not only adjustment of glossiness on the wafer back surface but also removal of a blue stain can be performed, a wafer having good quality on its back surface can be produced. It is preferable that glossiness on the back surface is 35-50%. For that purpose, it is preferable that a polishing amount (stock removal for polishing) is 0.4 µm or less and 0.05 µm or more, particularly, from about 0.1 µm to 0.3 µm.

The front surface polishing process is not particularly limited to any conditions in which peripheral sags are not generated by the polishing. However, if the polishing is performed particularly in multiple steps, it is preferable that a stock removal on an entire front surface is 4 µm or less. However, in order to obtain a good mirror-finished surface, the polishing is desirably performed about 1 µm.

As described above, by reducing the stock removal, a wafer having high flatness while maintaining flatness at the former processes can be produced.

Particularly, in the front surface (mirror) polishing process of the present invention, since a wafer having small waviness and a very shallow grinding striation (pit generated due to a grinding striation) is obtained, a stock removal can be extremely reduced and a mirror-polished wafer having high flatness can be obtained. Also, since the back surface polishing process is inserted prior to polishing, the transference of waviness on a back surface of the wafer into a front surface thereof can be lowered and a stock removal in front surface polishing can be further reduced. As the result, there are advantages that a nanotopography level of unevenness can be also reduced, the degradation of flatness due to polishing can be suppressed, and a wafer having high flatness can be obtained. Also, since a stock removal can be reduced, the productivity in the polishing process can be extremely improved.

Hereinafter, the present invention will be explained more specifically in reference to the examples and comparative examples below, but the present invention is not limited thereto.

EXAMPLE 1

As the result of the above consideration, in view of the pit depth, the surface condition, the etching rate, and the stability of the etchant, it was found that an etchant of which mixing ratio is hydrofluoric acid of 50% by weight:nitric acid of 70% by weight:phosphoric acid of 85% by weight=1:3:2, that is, an etchant of HF=6.6% by weight, $HNO_3$=34.0% by weight, $H_3PO_4$=32.5% by weight, the retained material of $H_2O$ (26.9% by weight), and the meltage of silicon=19 g/L, was preferable. The following is the explanation of examples using this acid etchant.

The following etching treatment was performed for lapped wafers (lapping abrasive grain size: #1200) having a diameter of 200 mm (8 inches). TTV of this lapped wafer was about 0.8 µm.

First, the wafers were immersed in an NaOH aqueous solution having a concentration of 50% by weight at 85° C. for 450 seconds in order to perform alkali etching with a target etching amount being set to 20 µm on both sides in total. Subsequently, the wafers were immersed into a hydrogen peroxide solution of 0.3% in order to make the surface of the wafers hydrophilic. Finally, the wafers were subjected to acid etching with the above mixed acid of hydrofluoric acid of 50% by weight:nitric acid of 70% by weight: phosphoric acid of 85% by weight=1:3:2 (volume ratio) having a liquid temperature of 25° C. with a target etching amount being set to 10 µm on both sides in total. The etched wafers were measured for flatness (TTV), surface roughness (Ra), waviness, pit depth, and glossiness in order to evaluate the effect of etching. The results are shown in Table 4.

COMPARATIVE EXAMPLE 1

Acid etching was performed under the same conditions as Example 1 except that a conventional acetic acid type mixed acid of hydrofluoric acid of 50% by weight:nitric acid of 70% by weight:acetic acid of 100% by weight=1:2:1 (volume ratio) was used as an acid etchant. The results are also shown in Table 4.

TABLE 4

| Qualities of wafers (CW) after alkaline etching → acid etching | | | | | | |
|---|---|---|---|---|---|---|
| | The number of processed wafer | TTV (µm) | Ra (µm) | Waviness (µm) | Pit depth (µm) | Glossiness (%) |
| Example 1 | 150 | 0.92 | 0.16 | 0.029 | 3.2 | 40 |
| Comparative Example 1 | 50 | 1.01 | 0.23 | 0.034 | 6.0 | 36 |

According to Table 4, wafers having very good flatness (TTV) and waviness were able to be obtained in Example 1 (by using phosphoric acid type mixed acid). Also, wafers having very small pit depth were able to be produced.

Glossiness was equivalent to a conventional value, and it was found that glossiness was able to be adjusted within a standard range. Also, chamfered portions of the wafers had good surface roughness (Ra), and there is the effect of reduction of loads such as mirror finished chamfering.

Next, CW surfaces in the above Example 1 and Comparative Example 1 were polished. Each stock removal was set to 7 μm (target amount) on the entire front surface. As to polishing conditions, polishing was performed by using a polishing apparatus, which is a single wafer processing type polishing apparatus, a polishing pad, which is a nonwoven fabric type polishing pad, and a polishing agent, which is a colloidal silica polishing agent (pH=10.5).

Each TTV and SFQRmax of the polished wafers were measured, and each external appearance was inspected.

In this regard, SFQR (Site Front least-sQuares Range) means the value that an average plain of a surface standard as to flatness is calculated in every site, and the maximum range of unevenness with respect to the surface is expressed. SFQRmax means the maximum value among SFQR values of all the sites on the wafer.

The results were shown in Table 5. Also, as for Comparative Example 1, polishing was further performed until these abnormal external appearances were not appeared (Comparative Example 1b).

TABLE 5

Qualities of wafers (PW) after polishing

| | The number of processed wafer | TTV (μm) | SFQRmax (μm) | External appearance | Stock removal (μm) |
|---|---|---|---|---|---|
| Example 1 | 150 | 0.68 | 0.095 | Nothing particular | 6.97 |
| Comparative Example 1 | 50 | 0.70 | 0.125 | There were remaining pits | 6.95 |
| Comparative Example 1 b | 50 | 0.78 | 0.161 | Nothing particular | 9.90 |

Flatness TTV and SFQRmax were measured by using a flatness measuring device (U/G9500, U/S9600) made by ADE Corporation. Surface roughness (Ra) was measured by use of a universal surface shape measuring device (Type: SE-3C) made by Kosaka Laboratory Ltd.

Also, each flatness SFQRmax was measured by use of a flatness measuring device made by ADE Corporation and evaluated in areas of 20 mm×20 mm. As to appearances, the existence of pits was confirmed with a microscope.

As clear from the above results, in Example 1, a wafer having high flatness and no bad condition in appearance (pits) was able to be produced by polishing of which stock removal was 7 μm or less. This was able to be accomplished so that pit depth after etching was lowered less than conventional one by alkaline etching and acid etching containing phosphoric acid. Also, since the stock removal was able to be reduced, the polishing efficiency was able to be improved, peripheral sags generated due to polishing were able to be prevented, so that a wafer having good flatness on a wafer periphery was able to be produced.

As described above, the CW is subjected to alkaline etching and acid etching containing phosphoric acid, so that its flatness and pit depth can be improved. Also, a wafer having less waviness can be obtained. Glossiness of both the Comparative Example and the Example can be controlled equal to each other.

As for the PW, it can be seen that since there is abnormal appearance in the Comparative Example, a stock removal is not enough. Generally, in order to completely remove pits after etching, it is necessary to excessively polish a wafer about pit depth+three micrometers. If a polishing amount is increased, its processing time is also increased. Also, as seen from the Comparative Example, SFQRmax is degraded when a stock removal is increased. It is preferable that a stock removal is small. In the acid etching containing phosphoric acid, the stock removal was able to be reduced, and a mirror-polished wafer having good flatness such as SFQRmax was able to be produced.

EXAMPLE 2

Mirror-polished wafers were produced in the process as shown in FIG. 1(b), the wafers were prepared by slicing an ingot having a diameter of about 200 mm, the sliced wafers were subjected to first chamfering, then the wafers were lapped by using a lap slurry (lapping abrasive grain size: #1200), and by using the wafer (called lapped wafer), surface grinding was performed on the following conditions.

Surface grinding was performed by using an in-feed type single-side grinding apparatus, a spindle rotational speed was 5500 rpm, a wafer rotational speed was 7 rpm, and the feed rate of a grinding stone was 0.2 μm/sec. Then after, second chamfering was performed.

After this surface grinding, flatness (TTV) of the wafer was about 0.6 μm.

Next, as to alkaline etching, the wafers were immersed in an NaOH aqueous solution having a concentration of 50% by weight at 85° C. for 450 seconds in order to perform alkali etching with a target etching amount being set to 20 μm on both sides in total. Subsequently, the wafers were immersed into a hydrogen peroxide solution of 0.3% in order to make the surface of the wafers hydrophilic. Finally, the wafers were immersed in a mixed acid of hydrofluoric acid of 50% by weight:nitric acid of 70% by weight: phosphoric acid of 85% by weight=1:3:2 (volume ratio) having a liquid temperature of 25° C. in order to perform acid etching with a target etching amount being set to 10 μm on both sides in total.

The acid-etched wafers were measured for flatness (TTV), surface roughness (Ra), waviness, visual inspection (and pit depth), and glossiness on each back surface of the wafers in order to evaluate the effect of surface grinding+etching.

TTV was measured by using a flatness measuring device (U/G9500 and U/S9600) made by ADE Corporation. Ra was measured by using the universal surface shape measuring device (Type: SE-3C) made by Kosaka Laboratory Ltd., and measurement was performed on a central area of the surface of the wafers.

Waviness is defined such that the vertical position of a start point and an end point of measurement that are determined to have the same height is assumed as the origin in the height direction, the absolute values $Y_1$ to $Y_{29}$ of displacement from the origin are measured at intervals of 2 mm, and the average of the absolute values Y1 to Y29 represents waviness. Waviness was measured by using the universal surface shape measuring device (Type: SE-3F) made by Kosaka Laboratory Ltd. Specifically, as for measurement, each central area of the wafers was traced for 60 mm through use of a stylus within in order to measure the surface shape excluding the component of fine surface roughness.

A visual inspection was performed by observing the presence of pits by a microscope.

If a pit was observed, its pit depth was confirmed. The pit depth was obtained by the depth of focus of a microscope. The pit depth was represented by the maximum value of estimated wafers.

Glossiness was obtained by a gloss meter SD made by TOYO SEIKI KOGYO Co., LTD. in terms of wafer back surfaces.

Above results were shown in Table 6.

TABLE 6

| Item Example Nos. | The number of processed wafers | TTV (μm) | Ra (μm) | Waviness (μm) | Pit depth (μm) | Glossiness (%) |
|---|---|---|---|---|---|---|
| Example 2 | 28 | 0.60 | 0.12 | 0.051 | 1.0 | 35 |
| Comparative Example 2 | 50 | 1.01 | 0.23 | 0.060 | 6.0 | 36 |

Next, the above-described etched wafers were mirror-polished. The surfaces, which were previously subjected to surface grinding, were polished, and the target amount of each stock removal was 4 μm.

As to polishing conditions, polishing was performed by using a polishing apparatus, which is a single wafer processing polishing apparatus, a polishing pad, which is a nonwoven fabric type polishing pad, and a polishing agent, which is a colloidal silica polishing agent (pH=10.5).

Each TTV and SFQRmax of polished wafers were measured and subjected to a visual inspection.

SFQR was measured by using the flatness measuring device made by ADE Corporation, and a size of each site was in an area of 20 mm×20 mm.

Results are shown in Table 7.

TABLE 7

| Item Example Nos. | The number of processed wafers | TTV (μm) | SFQRmax (μm) | Visual Inspection | Stock removal (μm) |
|---|---|---|---|---|---|
| Example 2 | 28 | 0.71 | 0.120 | Nothing particular | 4.00 |
| Comparative Example 2 - a | 50 | 0.70 | 0.125 | There were remaining pits | 4.00 |
| Comparative Example 2 - b | 50 | 0.78 | 0.161 | Nothing particular | 9.90 |

As seen from the above results, in Example 2, by polishing of which stock removal was 4 μm or less, a wafer having high flatness but no abnormal appearance (grinding striation or pit) was able to be produced. This was able to be accomplished, because before etching, particularly before alkaline etching, surface grinding was performed, and moreover, after alkaline etching in the etching process, acid etching by using mixed acid containing phosphoric acid was performed.

COMPARATIVE EXAMPLE 2

As in Example 2, etching process was performed by using lapped wafers (lapping abrasive grain size: #1200) having a diameter of 200 mm. The etching was performed through two steps of alkaline etching and acid etching by using mixed acid of hydrofluoric acid, nitric acid, and acetic acid.

As to alkaline etching, the wafers were immersed in an NaOH aqueous solution having a concentration of 50% by weight at 85° C. for 450 seconds in order to perform alkali etching with a target etching amount being set to 20 μm on both sides in total. Subsequently, after the wafers were immersed into a hydrogen peroxide solution of 0.3% in order to make the surface of the wafers hydrophilic, the wafers were immersed in a mixed acid of hydrofluoric acid of 50% by weight:nitric acid of 70% by weight:acetic acid of 100% by weight=1:2:1 (volume ratio) having a liquid temperature of 25° C. in order to perform acid etching with a target etching amount being set to 10 μm on both sides in total.

The etched wafers were measured for flatness (TTV), surface roughness (Ra), waviness, visual inspection (and pit depth), and glossiness. The results are included in Table 6.

Next, the wafers after the above etchings were mirror-polished. The target amount of each stock removal was 4 μm. Polishing conditions were the same as Example 2.

As for the polished wafer, each TTV and SFQRmax was measured and a visual inspection was performed. The results are included in Table 7.

As seen from the above results, in Comparative Example 2, when a stock removal was set at 4 μm, pits were present thereon (Table 7: Comparative Example 2-a).

Polishing was further performed until pits were disappeared (Table 7: Comparative Example 2-b). As the result, although pits were removed by polishing of about 10 μm from the whole front surface, its flatness was degraded in some degree.

EXAMPLE 3

Mirror-polished wafers were produced by the process as shown in FIG. 2. The wafers were obtained by slicing a single crystal rod (ingot) having a diameter of 200 mm and resistivity of 0.02 Ü·cm with a wire saw, and after a first chamfering, the wafers were subjected to lapping of 40 μm on both sides in total by using lapping slurry (lapping abrasive grain size: #1200). Next, replacing the above lapping slurry with lapping slurry of lapping abrasive grain size of #1500, the wafers were further subjected to lapping of 20 μm on both sides in total.

Subsequently, surface grinding was performed. The surface grinding was performed by using an in-feed type single-side grinding apparatus and using a grinding stone of #4000 at 10 μm on a single side of the wafers. The conditions of the surface grinding were that a spindle rotational speed was 5500 rpm, a wafer rotational speed was 7 rpm, and the feed rate of the grinding stone was 0.2 μm/sec. Then after, a second chamfering was performed.

At this stage, conventionally, local damages (pits) were formed on a wafer in a lapping process due to abrasive grains, but the surface grinding was able to be conducted with few local mechanical damages on the wafers. Each flatness (TTV) of the wafers after this surface grinding was about 0.6 μm.

Next, as an etching process, first, the wafers were immersed in an NaOH aqueous solution having a concentration of 50% by weight at 85° C. in order to perform alkali etching with a target etching amount being set to 15 μm on both sides in total. Subsequently, after the wafers were immersed into a hydrogen peroxide solution of 0.3% in order to make the surface of the wafers hydrophilic, the wafers were immersed into a mixed acid of hydrofluoric acid of 50% by weight:nitric acid of 70% by weight phosphoric acid of 85% by weight=1:3:2 (volume ratio) having a liquid temperature of 25° C. in order to perform acid etching with a target etching amount being set to 5 μm on both sides in total.

Next, each back surface of the wafers was polished.

As to polishing conditions, polishing was performed by using a polishing apparatus, which is a single wafer processing polishing apparatus, a polishing pad, which is a nonwoven fabric type polishing pad, and a polishing agent, which is a colloidal silica polishing agent (pH=10.5). Each stock removal was 0.1 μm.

In this regard, each stock removal can also be set about 0.05-0.3 μm depending on its glossiness.

Next, each chamfered portion on each periphery of the wafers was mirror-polished.

Each front surface of the wafers in which such a process was completed was mirror-polished. The polishing was performed by plural steps (three steps of a first polishing, a second polishing, and a finish polishing). Each target stock removal amount on the whole front surface was 3 μm. As to main polishing conditions, polishing was performed by using a polishing apparatus, which is a single wafer processing polishing apparatus, a polishing pad, which is a nonwoven fabric type polishing pad, and a polishing agent, which is a colloidal silica polishing agent (pH=10.5).

The polished wafers were confirmed in terms of TTV and SFQRmax, glossiness of each back surface, visual inspection, and nanotopography.

Each TTV and SFQRmax were measured by using a flatness measuring device (U/G9500 and U/S9600) made by ADE Corporation. SFQR was measured by using the flatness measuring device made by ADE Corporation, and the size of each site was in an area of 20 mm×20 mm.

As to a visual inspection, the existence of a pit was confirmed with a microscope.

If a pit was observed, its pit depth was confirmed. The pit depth was obtained by the depth of focus of a microscope. Also, the generation of stains or the like on a wafer back surface was confirmed by a visual inspection.

Glossiness was measured with reference to JIS Z 8741 (mirror glossiness measurement method) by the method according to that standards by using a mirror glossiness meter (glossmeter SD) designated by that standards.

Nanotopography (sometimes called nanotopology) is unevenness of which wavelength is about 0.1-20 mm and amplitude is about several nanometers to 100 nanometers, and its evaluation method is that height difference (P-V value: Peak to Valley) on a wafer surface is estimated in the region of a block range (called WINDOW SIZE or the like) of a square shape about 0.1-10 mm on a side or a circular shape having a diameter of about 0.1-10 mm. This P-V value is also called Nanotopography Height or the like. As for a nanotopography, it is desired that a maximum value of flatness present in a wafer surface estimated, is small. In the Example of the present invention, plural block areas of a square 10 mm on a side were estimated and the maximum value of these P-V values was evaluated. The results were shown in Table 8.

TABLE 8

|  | TTV (μm) | SFQRmax (μm) | Glossiness on back surface (%) | Visual Inspection | Nanotopography (nm) |
| --- | --- | --- | --- | --- | --- |
| Example 3 | 0.70 | 0.118 | 41 | Nothing particular on front surface and back surface | 50.0 |
| Comparative Example 3 | 0.78 | 0.160 | 36 | Stains were confirmed on back surface | 103.2 |

As seen from the above results, in Example 3, a wafer having high flatness but no abnormal appearance (no grinding striation, pit or blue stain) can be produced by polishing of 4 μm or less. Particularly, since fine unevenness at nanotopography level can improved, it is found to be preferable.

This can be accomplished such that the surface grinding was performed before etching, particularly before alkaline etching, and moreover the etching with mixed acid containing phosphoric acid was performed after alkaline etching in the etching process, and the polishing on a wafer back surface was performed. Also, there were no stains or the like on the wafer back surface, and its glossiness was good, because it was controlled in a proper value.

COMPARATIVE EXAMPLE 3

Figure 3:
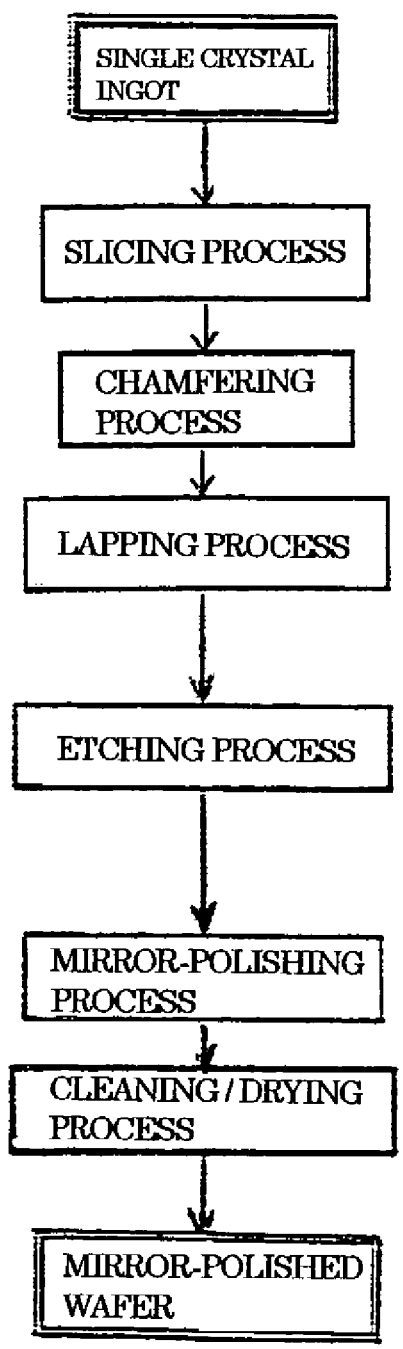
FIG. 3 is a flowchart showing an example of a conventional production process.

Mirror-polished wafers were produced through the process as shown in FIG. 3. As in Example 3, wafers were obtained by slicing a single crystal rod (ingot) having a diameter of 200 mm and resistivity of 0.02 U·cm by a wire saw, and after a first chamfering, the wafers were subjected to a lapping of 40 μm on both sides in total by using a lapping slurry (lapping abrasive grain size: #1200). Next, replacing the lapping slurry with a lapping slurry of lapping abrasive grain size of #1500, the wafers were further subjected to a lapping of 20 μm on both sides in total.

Next, an etching process was performed. The etching was performed through two steps of an alkaline etching and an acid etching by using mixed acid of hydrofluoric acid, nitric acid and acetic acid.

As to the alkaline etching, the wafers were immersed in an NaOH aqueous solution having a concentration of 50% by weight at 85° C. for 450 seconds in order to perform alkali etching with a target etching amount being set to 20 μm on both sides in total. Subsequently, after the wafers were immersed into a hydrogen peroxide solution of 0.3% in order to make the surface of the wafers hydrophilic, the wafers were immersed in a mixed acid of hydrofluoric acid of 50% by weight:nitric acid of 70% by weight:acetic acid of 100% by weight=1:2:1 (volume ratio) having a liquid temperature of 25° C. in order to perform acid etching with a target etching amount being set to 10 μm on both sides in total.

After such a process was completed, each front surface of the wafers was mirror-polished as in Example 3. The polishing was performed by plural steps (three steps of a first polishing, a second polishing, and a finish polishing). A target stock removal amount on the whole front surface was 3 μm. As to main polishing conditions, a polishing was performed by using a polishing apparatus, which is a single wafer processing polishing apparatus, a polishing pad, which is a nonwoven type polishing pad, and a polishing agent, which is a colloidal silica polishing agent (pH=10.5).

The polished wafers were confirmed in terms of TTV and SFQRmax, glossiness on each back surface, visual inspection, and nanotopography as in Example 3. The results are included in Table 8.

As seen from the above results, all of TTV, SFQRmax, and nanotopography are inferior to those of Example 3. Also, since the wafers have a small resistivity, there were stains thereon.

In this regard, the present invention is not limited to the embodiment described above. The above-described embodiment is a mere example, and those having substantially the same structure as that described in the appended claims and providing the similar functions and advantages are included in the scope of the present invention.

For example, if etching was performed by using a lapped wafer having a higher flatness than that used in the above Examples, a wafer having better flatness than that produced in the above Examples can be produced. In short, in the present invention, though the degradation of flatness due to etching can be reduced, the absolute value of TTV is also influenced by the quality of a lapped wafer.

Also, a pit depth is also slightly influenced by a lapping abrasive grain size used in lapping. Generally, lapping abrasive grains of about #1200 are used in a lapping process. However, its pit depth can be further improved by using lapping abrasive grains of #1500.

Also, Examples of the present specification exemplify the conditions capable of obtaining a wafer having high flatness that alkaline etching was performed with an etching amount of about 20 μm on both sides in total, and acid etching was performed with an etching amount of about 10 μm on both sides in total. However, these stock removals are not limited thereto, and it is possible that a proportion of alkaline etching is further lowered or total etching amount is reduced. In accordance with the required quality of a wafer, the proportion of alkaline etching and acid etching is controlled, so that a wafer having high flatness and shallow pit depth can be produced.

Moreover, the Examples describe the production method of a wafer of which one side is highly mirror-polished, for example. However, the present invention is not limited thereto, and the present invention can apply to the production method of a wafer of which both sides are highly mirror-polished. As for the CW obtained through alkaline etching and acid etching containing phosphoric acid, since each pit depth of both sides of the CW can be improved, each stock removal can be reduced when both sides thereof are polished, and the wafer can be processed to have high flatness as in the case that one side of a wafer is polished.

Particularly, the process as shown in FIG. 1(a) that a lapping process is omitted is preferable, and both sides of a wafer can be ground by using a duplex grinding apparatus in the surface grinding process. After that, since the pit depth of both sides of the wafer, which is already subjected to alkaline etching and acid etching containing phosphoric acid, is improved, its stock removal can be reduced when both sides thereof are polished, and the wafer can be processed to have high flatness as in the case that one side of a wafer is polished.

Also, the above embodiment describes the case of producing silicon wafers having a diameter of 200 mm (8 inches) in reference to Examples, for example. However, the present invention is not limited thereto, and the present invention can apply to a silicon single crystal having a diameter of from 4-16 inches or more.

The invention claimed is:

1. A method for processing a semiconductor wafer that the wafer obtained by slicing a single crystal ingot is subjected to at least a chamfering process, a lapping process, an etching process, and a mirror-polishing process, wherein the etching process is performed before the mirror-polishing process, the etching process is performed to both sides of the wafer, acid etching is performed after alkaline etching as the etching process, and the acid etching is performed with an acid etchant consisting of hydrofluoric acid, nitric acid, phosphoric acid, and water.

2. The method for processing a semiconductor wafer according to claim 1, wherein a total etching amount on both sides of the wafer in the etching process is 30 μm or less.

3. The method for processing a semiconductor wafer according to claim 1, wherein a stock removal in the mirror-polishing process is 7 μm or less.

4. The method for processing a semiconductor wafer according to claim 1, wherein a composition ratio of the acid etchant in use is that the concentration of hydrofluoric acid is 1-7% by weight and the concentration of phosphoric acid is 18-33% by weight.

5. The method for processing a semiconductor wafer according to claim 1, wherein an alkaline etchant used in the alkaline etching is an NaOH aqueous solution or a KOH aqueous solution.

6. The method for processing a semiconductor wafer according to claim 1, wherein a composition ratio of the acid etchant in mixing is that the concentration of hydrofluoric acid is 5-15% by weight and the concentration of phosphoric acid is 10-40% by weight.

7. The method for processing a semiconductor wafer according to claim 6, wherein silicon is dissolved in the acid etchant so as to have a silicon concentration of 10 g/L or more.

8. A method for processing a semiconductor wafer that the wafer obtained by slicing a single crystal ingot is subjected to at least a chamfering process, a surface grinding process, an etching process, and a mirror-polishing process, wherein the etching process is performed before the mirror-polishing process, the etching process is performed to both sides of the wafer, the surface grinding process is performed prior to the etching process, acid etching is performed after alkaline etching as the etching process, and the acid etching is performed with an acid etchant consisting of hydrofluoric acid, nitric acid, phosphoric acid, and water.

9. The method for processing a semiconductor wafer according to claim 8, wherein a lapping process is further added to the method and the processing is performed by a lapping process, a surface grinding process, and an etching process in order.

10. The method for processing a semiconductor wafer according to claim 8, wherein the surface grinding process is performed so that a peripheral portion of the wafer becomes thicker.

11. The method for processing a semiconductor wafer according to claim 8, wherein a total etching amount on both sides of the wafer in the etching process is 30 μm or less.

12. The method for processing a semiconductor wafer according to claim 8, wherein a stock removal in the mirror-polishing process is 7 μm or less.

13. The method for processing a semiconductor wafer according to claim 8, wherein a composition ratio of the acid etchant in use is that the concentration of hydrofluoric acid is 1-7% by weight and the concentration of phosphoric acid is 18-33% by weight.

14. The method for processing a semiconductor wafer according to claim 8, wherein an alkaline etchant used in the alkaline etching is an NaOH aqueous solution or a KOH aqueous solution.

15. The method for processing a semiconductor wafer according to claim 8, wherein a composition ratio of the acid etchant in mixing is that the concentration of hydrofluoric acid is 5-15% by weight and the concentration of phosphoric acid is 10-40% by weight.

16. The method for processing a semiconductor wafer according to claim 15, wherein silicon is dissolved in the acid etchant so as to have a silicon concentration of 10 g/L or more.

17. A method for processing a semiconductor wafer that the wafer obtained by slicing a single crystal ingot is subjected to at least a flattening process, an etching process, and a mirror-polishing process, wherein the flattening process is performed as a previous step of the etching process, the etching process is performed to both sides of the wafer, acid etching is performed after alkaline etching as the etching process, the acid etching is performed with an acid etchant consisting of hydrofluoric acid, nitric acid, phosphoric acid, and water, and a back surface polishing process is performed as the mirror-polishing process after the acid etching, and then a front surface polishing process is performed.

18. The method for processing a semiconductor wafer according to claim 17, wherein a total etching amount on both sides of the wafer in the etching process is 30 μm or less.

19. The method for processing a semiconductor wafer according to claim 17, wherein a stock removal in the mirror-polishing process is 7 μm or less.

20. The method for processing a semiconductor wafer according to claim 17, wherein a composition ratio of the acid etchant in use is that the concentration of hydrofluoric acid is 1-7% by weight and the concentration of phosphoric acid is 18-33% by weight.

21. The method for processing a semiconductor wafer according to claim 17, wherein an alkaline etchant used in the alkaline etching is an NaOH aqueous solution or a KOH aqueous solution.

22. The method for processing a semiconductor wafer according to claim 17, wherein the flattening process comprises a lapping process and/or a surface grinding process.

23. The method for processing a semiconductor wafer according to claim 22, wherein the surface grinding process is performed so that a peripheral portion of the wafer becomes thicker.

24. The method for processing a semiconductor wafer according to claim 17, wherein the back surface polishing process is performed so that glossiness of the wafer is 35-50%.

25. The method for processing a semiconductor wafer according to claim 24, wherein the surface grinding process is performed so that a peripheral portion of the wafer becomes thicker.

26. The method for processing a semiconductor wafer according to claim 17, wherein a composition ratio of the acid etchant in mixing is that the concentration of hydrofluoric acid is 5-15% by weight and the concentration of phosphoric acid is 10-40% by weight.

27. The method for processing a semiconductor wafer according to claim 26, wherein silicon is dissolved in the acid etchant so as to have a silicon concentration of 10 g/L or more.

* * * * *